US005200297A

United States Patent [19]

Kelly

[11] Patent Number: 5,200,297

[45] Date of Patent: Apr. 6, 1993

[54] LAMINAR THERMAL IMAGING MEDIUMS, CONTAINING POLYMERIC STRESS-ABSORBING LAYER, ACTUATABLE IN RESPONSE TO INTENSE IMAGE-FORMING RADIATION

[75] Inventor: Neal F. Kelly, Woburn, Mass.

[73] Assignee: Polaroid Corporation, Cambridge, Mass.

[21] Appl. No.: 616,854

[22] Filed: Nov. 21, 1990

[51] Int. Cl.[5] ............................ G03F 7/34; G03F 7/11

[52] U.S. Cl. .................................... 430/253; 430/258; 430/259; 430/262; 430/273

[58] Field of Search ............... 430/253, 200, 258, 259, 430/261, 262, 273

[56] References Cited

U.S. PATENT DOCUMENTS 2,616,961 11/1952 Groak .
3,257,942 6/1966 Ritzerfeld et al. .
3,340,086 9/1967 Groak .
3,396,401 8/1968 Nonomura .
3,592,644 7/1971 Vrancken et al. .
3,632,376 1/1972 Newman .
3,924,041 12/1975 Miyayama et al. .
4,123,578 10/1978 Perrington et al. .
4,157,412 6/1979 Deneau .
4,987,051 1/1991 Taylor, Jr. .......................... 430/253
5,155,003 10/1992 Chang ................................ 430/253

FOREIGN PATENT DOCUMENTS 8804237 6/1988 PCT Int'l Appl. .
1156996 7/1969 United Kingdom .

*Primary Examiner*—Charles L. Bowers, Jr.
*Assistant Examiner*—Christopher G. Young
*Attorney, Agent, or Firm*—Louis G. Xiarhos

[57] ABSTRACT

There is disclosed a laminar thermal imaging medium comprising a pair of sheet members and at least a layer of image-forming substance confined therebetween in laminar relation thereto, said laminar thermal imaging medium being actuatable in response to intense image-forming radiation for production of an image in said image-forming substance, said medium material having a tendency toward stress-induced adhesive failure at the interface therein having the weakest adhesivity, and such tendency being reduced by a polymeric stress-absorbing layer in close proximity to said interface, said polymeric stress-absorbing layer being capable of absorbing physical stresses applied to said laminar thermal imaging medium.

20 Claims, 1 Drawing Sheet

LAMINAR THERMAL IMAGING MEDIUMS, CONTAINING POLYMERIC STRESS-ABSORBING LAYER, ACTUATABLE IN RESPONSE TO INTENSE IMAGE-FORMING RADIATION

BACKGROUND OF THE INVENTION

This invention relates to a thermal imaging medium for the recordation of information. More particularly, it relates to a laminar imaging medium having improved resistance to stress-induced delamination.

The provision of images by resort to media which rely upon the generation of heat patterns has been well known. Thermally imageable media are particularly advantageous inasmuch as they can be imaged without certain of the requirements attending the use of silver halide based media, such as darkroom processing and protection against ambient light. Moreover, the use of thermal imaging materials avoids the requirements of handling and disposing of silver-containing and other processing streams or effluent materials typically associated with the processing of silver halide based imaging materials.

Various methods and systems for preparing thermally generated symbols, patterns or other images have been reported. Examples of these can be found in U.S. Pat. No. 2,616,961 (issued Nov. 4, 1952 to J. Groak); in U.S. Pat. No. 3,257,942 (issued June 28, 1966 to W. Ritzerfeld, et al.); in U.S. Pat. No. 3,396,401 (issued Aug. 6, 1968 to K. K. Nonomura); in U.S. Pat. No. 3,592,644 (issued July 13, 1971 to M. N. Vrancken, et al.); in U.S. Pat. No. 3,632,376 (issued Jan. 4, 1972 to D. A. Newman); in U.S. Pat. No. 3,924,041 (issued Dec. 2, 1975 to M. Miyayama, et al.); in U.S. Pat. No. 4,123,578 (issued Oct. 31, 1978 to K. J. Perrington, et al.); in U.S. Pat. No. 4,157,412 (issued June 5, 1979 to K. S. Deneau); in Great Britain Patent Specification 1,156,996 (published July 2, 1969 by Pitney-Bowes, Inc.); and in International Patent Application No. PCT/US87/03249 of M. R. Etzel (published June 16, 1988, as International Publication No. WO 88/04237).

In the production of a thermally actuatable imaging material, it may be desirable and preferred that an image-forming substance be confined between a pair of sheets in the form of a laminate. Laminar thermal imaging materials are, for example, described in the aforementioned U.S. Pat. Nos. 3,924,041 and 4,157,412 and in the aforementioned International Patent Application No. PCT/US87/03249. It will be appreciated that the sheet elements of a laminar medium will afford protection of the image-forming substance confined therebetween against the effects of abrasion, rub-off and other physical stimuli. In addition, a laminar medium can be handled as a unitary structure, thus, obviating the requirement of bringing the respective sheets of a two-sheet imaging medium into proper position in the printer or other apparatus used for thermal imaging of the medium material.

In a laminar thermal imaging medium comprising at least a layer of image-forming substance confined between a pair of sheets, image formation may depend upon preferential adhesion of the image-forming substance to one of the sheets. Typically, such a laminar medium material will be designed such that the image-forming substance will be preferentially adherent to one of the sheets, before thermal actuation of regions of the laminar medium, and preferentially adherent to the other sheet in actuated or "exposed" regions. Accordingly, separation of the sheets of the laminar medium material, in the case where there has been no thermal actuation or "exposure", provides a layer of image-forming substance on the one sheet to which it is preferentially adherent. Separation of the sheets, of the medium material, in the case where the medium is exposed to radiation over its entire area and sufficient in intensity to reverse the preferential adhesion, provides the layer of image-forming substance on the opposite sheet.

Inasmuch as a laminar thermal imaging medium of the aforedescribed type will be designed such that the image-forming substance is preferentially adherent to only one of the sheets before and until thermal actuation, the laminar medium material may exhibit an undesirable tendency to delaminate upon subjection to handling, cutting or other stress-inducing conditions or operations. For example, it may be desirable to form a laminar medium from a pair of endless sheet or web materials and to then cut, slit or otherwise provide therefrom individual film units of predetermined size. A reciprocal cutting and stamping operation used for the cutting of individual film units may create stress influences in the medium, causing the sheets to separate at the point of weakest lamination—typically, at the interface where, upon thermal actuation, the preferential adhesion of the image-forming substance would be reversed. Individual film-sized units cut from a web of laminar material may, during handling in a printer or imaging apparatus, or as a result of a user flexing or otherwise torturing the film unit, delaminate in an undesired and premature fashion.

SUMMARY OF THE INVENTION

It has been found that the tendency for a thermally actuatable laminar imaging material of the aforedescribed type to delaminate can be substantially reduced, and the handling properties thereof substantially improved, by including in the laminar medium a polymeric stress-absorbing layer in close proximity to the interface having the greatest tendency toward adhesive failure, such polymeric stress-absorbing layer being capable of absorbing physical stress applied to the laminar imaging material and of reducing delamination at such interface.

According to an article or product aspect of the present invention, there is provided a laminar thermally actuatable imaging material comprising a pair of sheet members and at least a layer of image-forming substance confined therebetween in laminar relation thereto, said laminar thermally actuatable imaging material being actuatable in response to intense image-forming radiation for production of an image in said image-forming substance, said laminar thermally actuatable imaging material having a tendency toward stress-induced adhesive failure at the interface therein having the weakest adhesivity, and such adhesive failure being reduced by a polymeric stress-absorbing layer in close proximity to said interface, said polymeric stress-absorbing layer being capable of absorbing physical stress applied to the laminar imaging material.

For a fuller understanding of the nature and objects of the invention, reference should be had to the following description taken in conjunction with the accompanying drawings.

DETAILED DESCRIPTION OF THE INVENTION

As mentioned previously, the laminar thermally actuatable imaging medium material of the invention embodies a stress-absorbing layer for reducing the tendency of the material to delaminate in response to stress or other physical stimulus applied to the medium. It will be appreciated that the particular nature of the stress-absorbing layer and the positioning of the layer relative to the other layers of the medium material will depend upon the nature of such other layers, on the mechanism involved in image formation, on the degree of adhesion between the layers of the medium material and on the nature of and positioning of the adhesive interface which is most readily delaminated by physical stimulus.

Figure 1:
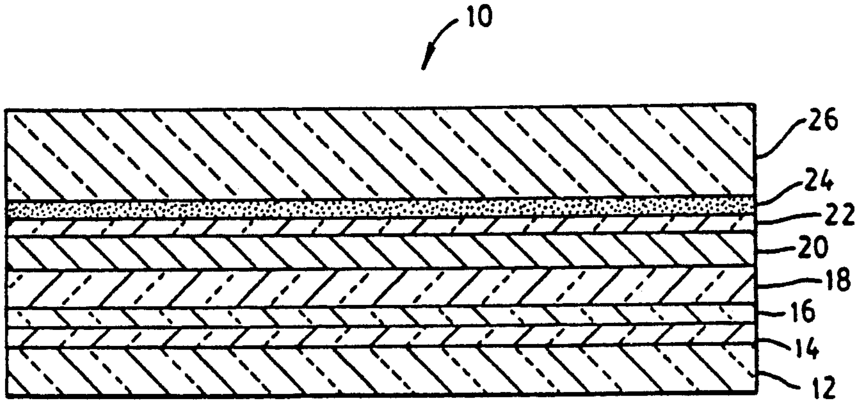
FIG. 1 is a diagrammatic cross-sectional view of a preferred laminar thermally actuatable imaging medium material of the invention.
Figure 2:
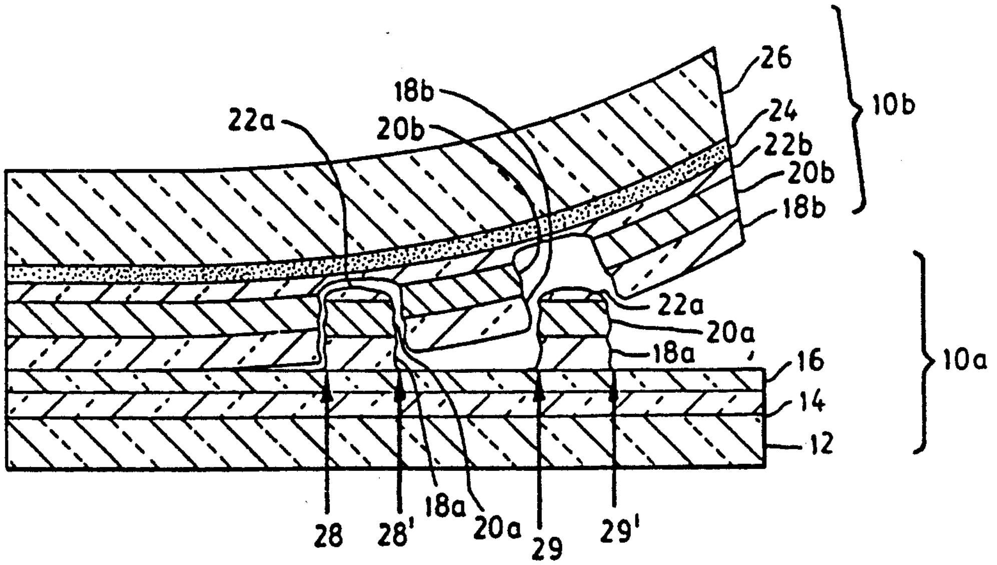
FIG. 2 is a diagrammatic cross-sectional view of the laminar imaging medium of FIG. 1, shown in a state of partial separation after thermal imaging.

In FIG. 1, there is shown a preferred laminar medium material of the invention suited to production of a pair of high resolution images, shown in FIG. 2 as images 10*a* and 10*b* in a partial state of separation. Thermal imaging medium 10 includes a first sheet-like web material 12 having superposed thereon, and in order, stress-absorbing layer 14, heat-activatable layer 16, intermediate layer 18 for surface protection of image 10*b*, image-forming layer 20, release layer 22, adhesive layer 24 and second sheet-like web material 26.

Upon exposure of medium material 10 to radiation, exposed portions of intermediate layer 18 (and image-forming layer 20) are more firmly attached to sheet-like web material 12, so that, upon separation of the respective sheet-like web materials, as shown in FIG. 2, a pair of images, 10*a* and 10*b*, is provided. The nature of certain of the layers of preferred thermal imaging medium material 10 and their properties are importantly related to the manner in which the respective images are formed and partitioned from the medium after exposure. The functioning of stress-absorbing layer 14 is important to the reduction of undesired delamination at the interface between layers 16 and 18 of the preferred thermal imaging medium shown in FIG. 1. The various layers of medium material 10 are described in detail hereinafter. It will be appreciated that other thermally actuatable media materials, particularly those which provide images by operation of different imaging mechanisms, will embody alternative layer arrangements and compositional requirements but that a stress-absorbing layer can be incorporated therein for reduction of the tendency for such media materials to delaminate in response to physical stimuli.

Sheet-like web material 12 comprises a transparent material through which imaging medium 10 can be exposed to radiation. Web material 12 can comprise any of a variety of sheet-like materials, although polymeric sheet materials will be especially preferred. Among preferred web materials are polystyrene, polyethylene terephthalate, polyethylene, polypropylene, poly(vinyl chloride), polycarbonate, poly(vinylidene chloride), cellulose acetate, cellulose acetate butyrate and copolymeric materials such as the copolymers of styrene, butadiene and acrylonitrile, including poly(styrene-coacrylonitrile). An especially preferred web material from the standpoints of durability, dimensional stability and handling characteristics is polyethylene terephthalate, commercially available, for example, under the tradename Mylar, of E. I. duPont de Nemours & Co., or under the tradename Kodel, of Eastman Kodak Company.

Stress-absorbing layer 14 reduces delamination of medium material 10 at the weakest adhesive interface, i.e., at the interface between heat-activatable layer 16 and intermediate layer 18 in the case of the preferred medium material shown in FIG. 1. It will be seen from inspection of FIG. 2, that in areas of exposure (between the pairs of arrows 28 and 28' and 29 and 29', respectively), intermediate layer 18 is attached firmly to heat-activatable layer 16 and that in areas of non-exposure, intermediate layer 18 is removed upon separation of sheets 12 and 26 after imaging, to provide surface protection for image 10*b*. Where sheets 12 and 26 are separated before imaging, the result is an adhesive failure between layers 16 and 18. Such failure can also be effected unintentionally by applying stress or mechanical shock to medium material 10. Delamination at the interface of layers 16 and 18, whether occurring during manufacturing operations, such as cutting or slitting operations, or in the course of handling of the medium material in a printer or other imaging device, effectively destroys the imageability and usefulness of the medium material.

Layer 14 comprises a polymeric layer having the capacity to absorb compressive force or to undergo an elastic stretching. Typically, a thermally actuatable medium material of the type described herein will comprise a pair of sheets of different thickness. The medium material can, therefore, be readily flexed or bent, with creation of stresses in the medium which cause a delamination. The presence of layer 14 serves to absorb these stresses so as to minimize this undesirable consequence.

A variety of polymeric materials can be used to provide a stress-absorbing layer 14. In general, layer 14 will comprise a polymeric material having a soft and compressible or elongatable character. Useful polymers will also typically be thermoplastic, although a thermoplastic character will not be a prerequisite. While applicant does not wish to be bound by any particular mechanism in explanation of the manner in which the occurrence of delamination is minimized, it is believed that, in addition to the absorption of physical stresses, the distribution of stresses and strains throughout layer 14 and to contiguous layers may be involved. Among polymers useful for the provision of stress-absorbing layer 14 are the copolyesters, such as those prepared by reaction of a glycol or other polyol (e.g., ethylene glycol, glycerol) with an aliphatic or aromatic dicarboxylic acid (or lower alkyl ester thereof) such as terephthalic, isophthalic adipic or sebacic acid; vinylidene chloride polymers, such as vinylidene chloride/vinylacetate copolymers; ethylene polymers, such as ethylene/vinylacetate copolymers; vinyl chloride polymers, such as vinyl chloride/vinylacetate copolymers; polyvinyl acetals, such as poly(vinyl butyral); acrylate copolymers, such as poly(methylmethacrylate-co-butylmethacrylate); synthetic rubber polymers, such as styrene/butadiene; styrene polymers, such as poly(styrene) and poly(styrene-co-butadiene-co-acrylonitrile); and polyurethanes. It will be appreciated that molecular weights of the aforedescribed polymers can be controlled in known manner, to provide polymers having desired softness, compressibility or elastic properties.

Among preferred polymeric materials for layer 14 are the elastomeric polymers such as the elastomeric polyurethanes, examples of which are known in the art, and which can be obtained from an aliphatic polyol, an aromatic diisocyanate and a chain-extending agent. Preferred and commercially available polyurethanes are the polyurethanes available as ICI XR-9619 and XR-9637 polyurethanes (from ICI Resins US, Wilmington, Mass.). Other polyurethanes can, however, be employed. Other preferred polymeric materials for layer 14 are the copolyesters of alkylene glycols (e.g., ethylene glycol and 1,4-butanediol) and aromatic terephthalate and isophthalic acids, commercially available, for example, as Bostik 7915 and 7975, from Bostik, Inc., Division of Total Chemie.

Layer 14 can be applied to sheet material 12 by coating a solution of polymer onto sheet material 12 and allowing the coating to dry to a layer of predetermined thickness. The thickness of layer 14 can vary depending upon the nature and arrangement of layers of the medium in which the stress-absorbing layer is to be incorporated and upon the choice of stress-absorbing polymer. For example, thickness may vary with the remoteness (or proximity) of the layer to the interface having the weakest adhesivity, thicker layers, generally, being used in positions remote from such interface. Layer 14 can, for example, range in thickness from about 0.1 micron to about 50 microns, and preferably, in the range of from one micron to 20 microns. In the case of a medium material such as is shown in FIG. 1, embodying an elastomeric polyurethane stress-absorbing layer 14, good results can be obtained using a layer having a thickness in the range of from 0.25 micron to five microns. Other polymeric layers of different thickness can, however, be used.

Stress-absorbing layer 14 can comprise a single polymeric material having desired compressibility or elongation characteristics or a mixture of polymeric materials. Various additives can be included to provide desired functionality. For example, plasticizers, tack-promoting agents, thickeners, light-absorbing agents and fillers can be included in stress-absorbing layer 14. Polymeric materials which provide an adhesion-promoting function can be included, for example, to provide sufficient adhesion between stress-absorbing layer 14 and heat-activatable layer 16, so that, upon separation of sheets 12 and 26 after image formation, an undesired separation between layers 14 and 16 is avoided.

In general, the nature of the principal and additive components of stress-absorbing layer 14 will be such as to provide minimal adverse affect on desired imageability of the medium material. As is described in greater detail hereinafter, thermal imaging is accomplished in the medium material shown in FIGS. 1 and 2 by exposure in the direction shown by the arrows in FIG. 2. The presence of materials in stress-absorbing layer 14 which may, for example, be absorptive of the exposing radiation, and which may increase imaging power requirements or otherwise adversely affect desired imaging at the interface of layers 16 and 18, should only be employed judiciously or should be avoided.

The positioning of polymeric stress-absorbing layer 14 is such that it is in close proximity to the interface having the greatest tendency to delaminate upon application of physical stimulus to the medium material. It will be appreciated that layer 14 can be positioned at alternative locations in a medium structure, particularly where the several layers thereof are thin and on the order of less than a micron to a few microns in thickness. In the case of medium material 10 of FIG. 1, physical stresses tend, where layer 14 is not present, to result in delamination at the interface between layers 16 and 18. The presence of stress-absorbing layer 14 adjacent to layer 16, i.e., between sheet 12 and heat-activatable layer 16, serves to provide protection against stress-induced delamination.

Heat-activatable layer 16 provides an essential function in the imaging of medium material 10 and comprises a polymeric material which is heat activatable upon subjection of the medium to brief and intense radiation, so that, upon rapid cooling, exposed portions of the surface zone or layer are firmly attached to intermediate layer 18. A suitable material for layer 16 comprises a polymeric material which tends readily to soften so that exposed portions of layer 16 and layer 18 can be firmly attached to web 12. A variety of polymeric materials can be used for this purpose, including polystyrene, poly(styrene-co-acrylonitrile), poly(vinyl butyrate), poly(methylmethacrylate), polyethylene and poly(vinyl chloride).

The employment of a thin heat-activatable layer 16 on a substantially thicker and durable web material 12 (carrying additionally stress-absorbing layer 14) permits desired handling of web material 12 and desired imaging efficiency. The use of a thin layer 16 facilitates the concentration of heat energy at or near the interface between layers 16 and 18 and permits optimal imaging effects and reduced energy requirements. It will be appreciated that the sensitivity of layer 16 to heat activation (or softening) and attachment or adhesion to layer 18 will depend upon the nature and thermal characteristics of layer 16 and upon the thickness thereof. Good results are obtained using, for example, a web material 12 having a thickness of about 1.5 to 1.75 mils (0.038 to 0.044 mm) carrying a stress-absorbing layer of about 0.25 to five microns in thickness and a layer 18 of poly(styrene-coacrylonitrile) having a thickness of about 0.1 micron to five microns.

Heat-activatable layer 16 can be provided on web material 12 by resort to known coating methods. For example, a layer of poly(styrene-co-acrylonitrile) can be applied to a web 12 of polyethylene terephthalate by coating from an organic solvent such as methylethyl ketone or toluene onto stress-absorbing layer 14. In general, the desired handling properties of sheet material 12 will be dependent upon the characteristics of the sheet material itself, inasmuch as layers 14 and 16 are coated thereon as thin layers. The thickness of sheet material 12 will depend upon the desired handling characteristics of medium material 10 during manufacture and during imaging and post-imaging separation steps. Thickness will also be determined in part by the desired and intended use of the image to be carried thereon. Typically, sheet material 12 will vary in thickness from about 0.5 mil to seven mils (0.013 mm to 0.178 mm). Thickness may also be influenced by exposure conditions, such as the power of the exposing source of radiation. Good results can be obtained using a polymeric sheet 12 having a thickness of about 0.75 mil (0.019 mm) to about two mils (0.051 mm) although other thicknesses can be employed.

As in the case of stress-absorbing layer 14, heat-activatable layer 16 can include additives or agents providing known beneficial properties. Adhesivenessimparting agents, plasticizers, adhesion-reducing agents, or other agents can be used. Such agents can be used, for example, to control adhesion between layers 14 and 16 or between 16 and 18 (or between layers 16 and 20 where no layer 18 is present) so that partitioning can be accomplished in the manner shown in FIG. 2.

Layer 18, as shown in FIG. 1, is an optional layer and comprises a thermoplastic material superposed upon and contiguous with layer 16 of web material 12. Thermoplastic layer 18 serves as a protective layer for image 10*b*, by providing surface protection and resistance against abrasion of the porous or particulate image-forming substance 20*b*. As can be seen from FIG. 1, layer 18 of imaging medium 10, before thermal imaging, is an internal or intermediate layer among the several layers shown as component layers of the medium. After imaging, and upon separation of sheets 12 and 26, portions 18*b* of layer 18 provide desired durability to image 10*b*.

For the production of images of high resolution, it will be essential that layers 18 and 20 comprise materials that permit fracture through the thickness of the layers and along a direction substantially orthogonal to the interface of the layers, i.e., substantially along the direction of arrows 28, 28', 29 and 29', shown in FIG. 2. It will be appreciated that, in order for images 10*a* and 10*b* to be partitioned in the manner shown in FIG. 2, each of intermediate/protective layer 18 and imaging-forming layer 20 will be orthogonally fracturable as aforedescribed and that layer 18 have a degree of cohesivity in excess of its adhesivity for heat-activatable layer 16. In addition, the cohesivity of layer 18 is in excess of the adhesivity of the layer to porous or particulate image-forming layer 20. Thus, on separation of webs 12 and 26 after imaging, layer 18 will separate in non-exposed regions from heat-activatable layer 16 and remain on porous or particulate regions 20*b* as a protective surface material 18*b*.

As can be seen from FIG. 2, the relationships of adhesivity and cohesivity among the several layers of imaging medium 10 are such that separation occurs between layer 18 and heat-activatable layer 16 in non-exposed regions. Thus, imaging medium 10, if it were to be separated without exposure, would separate between heat-activatable layer 16 and layer 18 to provide a $D_{max}$ on sheet 26. The nature of layer 18 (or of image-forming layer 20 where optional layer 18 is not employed) is such, however, that its relatively weak adhesion to heat-activatable layer 16 can be substantially increased upon exposure. Thus, as shown in FIG. 2, exposure of medium 10 to brief and intense radiation in the direction of the arrows and in the areas defined by the respective pairs of arrows, serves in the areas of exposure to substantially lock or attach layer 18, as portions 18*a*, to heat-activatable layer 16.

Attachment of weakly adherent layer 18 (or image-forming layer 20 where intermediate/protective layer 18 is absent) to heat-activatable layer 16 in areas of exposure is accomplished by absorption of radiation within the imaging medium and conversion to heat sufficient in intensity to heat activate layer 16 and on cooling to more firmly join exposed regions or portions of layer 18 and/or 20 to heat-activatable layer 16. Thermal imaging medium 10 is capable of absorbing radiation at or near the interface of heat-activatable layer 16 and intermediate layer 18. This is accomplished by using layers in medium 10 which by their nature absorb radiation and generate the requisite heat for desired thermal imaging, or by including in at least one of the layers, an agent capable of absorbing radiation of the wavelength of the exposing source. Infrared-absorbing dyes can, for example, be suitably employed for this purpose.

If desired, porous or particulate image-forming substance 20 can itself comprise a pigment or other colorant material such as carbon black which, as is more completely described hereinafter, is absorptive of exposing radiation and which is known in the thermographic imaging field as a radiation-absorbing pigment. Inasmuch as a secure bonding or joining is desired at the interface of layer 18 and heat-activatable layer 16, it is preferred that a light-absorbing substance be incorporated into either or both of intermediate/protective layer 18 and heat-activatable layer 16. Where intermediate/protective layer 18 is not employed, either or both of image-forming and heat activatable layers 20 and 16, respectively, can include a light-absorbing substance.

Suitable light-absorbing substances in layers 16 and/or 18, for converting light into heat, include carbon black, graphite or finely divided pigments such as the sulfides or oxides of silver, bismuth or nickel. Dyes such as the azo dyes, xanthene dyes, phthalocyanine dyes or the anthraquinone dyes can also be employed for this purpose. Especially preferred are materials which absorb efficiently at the particular wavelength of the exposing radiation. In this connection, infrared-absorbing dyes which absorb in the infrared-emitting regions of lasers which are desirably used for thermal imaging are especially preferred. Suitable examples of infrared-absorbing dyes for this purpose include the alkylpyrylium-squarylium dyes, disclosed in U.S. Pat. No. 4,508,811 (issues Apr. 2, 1985 to D. J. Gravesteijn, et al.), and including 1,3-bis[2,6-di-t-butyl-4H-thiopyran-4-ylidene)methyl]-2,4-dihydroxy-dihydroxidecyclobutene diylium-bis{inner salt}. Other suitable IR-absorbing dyes include 4-[7-(4H-pyran-4-ylide)hepta-1,3,5-trienyl]pyrylium tetraphenylborate and 4-[[3-[7-diethylamino-2-(1,1-dimethylethyl)--benz[b]-4H-pyran-4-ylidene)methyl]-2-hydroxy-4-oxo-2-cyclobuten-1-ylidene]methyl]-7-diethylamino-2-(1,1-dimethylethyl)-benz[b]pyrylium hydroxide inner salt. These and other IR-absorbing dyes are disclosed in the commonly assigned patent application of Z. J. Hinz, et al., entitled Heptamethine Pyrylium Dyes, and Processes for Their Preparation and Use as Near Infra-Rad Absorbers, U.S. Ser. No. 07/616,651, filed of even date, and now abandoned; and in the commonly assigned and copending application of S. J. Telfer, et al., entitled Benzpyrylium Squarylium Dyes, and Processes for Their Preparation and Use, U.S. Ser. No. 07/616,639, filed of even date now abandoned.

From the standpoint of image resolution or sharpness, it is essential that image-forming layer 20 (and intermediate/protective layer 18, where present) be disruptible such that a sharp separation can occur between exposed and unexposed regions of the thermally imaged medium. This can be accomplished by forming the layers as layers of discontinuous or discrete particles. For example, thermoplastic polymer particles can be applied from an aqueous latex containing the polymeric particles in dispersion, to provide a fracturable intermediate/protective layer 18. Coating and drying of the latex at temperatures below the softening temperature of the polymeric particles allow the formation of a layer in which separation occurs at the interfaces between particles. Examples of polymeric materials which can be used include vinylic polymers, such as poly(methylmethacrylate), poly(vinylidene chloride), poly(vinyl acetate), poly(vinyl chloride), poly(styrene), poly(styrene-co-butadiene), poly(styrene-co-acrylonitrile) and poly(acrylonitrile), cellulosic materials such as cellulose acetate-butyrate and copolyesters such as the esters of aliphatic dicarboxylic acids and polyols, e.g., ethylene glycol. If desired, dispersions of polymeric thermoplastic particles can be prepared by introducing an organic solvent, such as methylene chloride, containing dissolved polymer, such as poly(styrene-coacrylonitrile), into an aqueous medium with agitation, and removing organic solvent to provide a coatable aqueous dispersion.

In the production of thermal imaging medium 10, a thermoplastic or resinous layer 18 can be applied onto heat-activatable layer 16 using known coating techniques for providing a thin layer of resinous material. Layer 18, as indicated previously, shows a degree of adhesion to heat-activatable layer 16 and, in general, will be sufficient to prevent accidental dislocation and to withstand (in part by reason of the presence of stress-absorbing layer 14) stresses created during manufacturing and handling operations. The degree of adhesion should be such, however, that desired separation in non-exposed regions can be accomplished in the manner shown in FIG. 2. The nature of layer 18 will also be such that its adhesion can be increased substantially in exposed regions as to be firmly attached to web material 12, as also shown in FIG. 2.

The thickness of layer 18 can vary and, in general, will be of at least such thickness that, upon exposure and separation of images, portions (18*b*) of layer 18 will be sufficient to confer protection for the surface of image 10*b*. While greater thicknesses will typically provide greater durability and protection, imaging efficiency and sensitivity may be reduced as a consequence of increasing the bulk of material to be heated at the interface of layer 18 and heat-activatable layer 16. Good results can be obtained using a layer in the range of about 0.1 micron to five microns, and preferably from about 0.3 micron to one micron. Where the durability of image 10*b* is not of paramount importance, intermediate/protective layer 18 can be omitted.

If desired, various additives such as plasticizers, binders, colorants, softeners or the like can be added to optional and intermediate/protective layer 18. Film-forming binders such as hydroxyethyl cellulose, polyvinyl alcohol, poly(styrene-co-maleic anhydride), poly(-vinyl butyrate) or the like can be employed. Surfactants can be included to promote dispersion of polymer particles and to aid in coatability. Lubricity-enhancing agents, such as silicones and waxes, can be included to provide an image 10*b* having enhanced lubricity and improved durability. Waxes such as carnauba wax and waxy materials such as the polyethylene oxides and low molecular weight polyethylene waxes can be employed for this purpose.

If desired, image 10*b*, after separation of images 10*a* and 10*b*, can be subjected to a heating step to improve durability. Depending upon the particular nature of layer 18, portions thereof (18*b* in FIG. 2) may, by coalescence or fusion, form a more durable and protective surface layer in image 10*b*, and a post-imaging heating step for this purpose will in some instances be preferred. A preferred material for layer 18 is a polymeric latex or dispersion which forms a layer having desirable disruptibility for high-resolution imaging and which in a post-imaging heating step provides a more durable and protective layer.

As indicated, layers 18 and 20 are disruptible layers which facilitate sharp separation between exposed and unexposed regions. Disruptability of layer 18 can be the result of including particulate matter in layer 18 to provide a discontinuous character and to assist in such separation. Thus, a layer 18 comprising a thermoplastic resin or wax or wax-like material can include solid particulate matter which serves to reduce the cohesivity of the thermoplastic layer and permit a sharper fracturing of the layer between exposed and unexposed areas. Examples of materials suited for this purpose are silica, clay materials such as kaolin, bentonite and attapulgite, alumina, calcium chloride, and pigments such as carbon black, milori blue, titania and baryta.

Thermoplastic layer 18 may be variously termed an internal or intermediate layer in thermal imaging medium 10, as shown in FIG. 1, or as a protective layer, notwithstanding that the protective attributes of layer 18 will only be manifest after imaging and separation of the respective images shown in FIG. 2, in the form of protective portions 18*b* of layer 18. It will be appreciated that layer 18 is also involved in the attachment of image-forming material in exposed areas at the interface of layer 18 and heat-activatable layer 16. In addition, the properties of layer 18 influence the mode of separation in non-exposed regions, as depicted in FIG. 2. It will be appreciated, however, that the requirements thereof will be different from and should be distinguished from the requirements of principal image-forming layer 20 of imaging medium 10.

Image-forming layer 20 comprises an image-forming substance deposited onto intermediate (or protective) layer 18 (or onto heat-activatable layer 16) as a porous or particulate layer or coating. Layer 20, also referred to as a colorant/binder layer, can be formed from a colorant material dispersed in a suitable binder, the colorant being a pigment or dye of any desired color, and preferably, being substantially inert to the elevated temperatures required for thermal imaging of medium 10. Carbon black is a particularly advantageous and preferred pigment material. Preferably, the carbon black material will comprise particles having an average diameter of about 0.01 to 10 micrometers (microns). Although the description hereof will refer principally to carbon black, other optically dense substances, such as graphite, phthalocyanine pigments and other colored pigments can be used. If desired, substances which change their optical density upon subjection to temperatures as herein described can also be employed.

The binder for the image-forming substance of layer 20 provides a matrix to form the porous or particulate substance thereof into a cohesive layer and serves to adhere layer 20 to intermediate/protective layer 18 (or to heat-activatable layer 16). Layer 20 can be conveniently deposited onto either layer 16 or layer 18, using any of a number of known coating methods. According to a one embodiment, and for ease in coating layer 20 onto layer 18, carbon black particles are initially suspended in an inert liquid vehicle (typically, water) and the resulting suspension or dispersion is uniformly spread over heat-activatable layer 16 or intermediate layer 18. On drying, layer 20 is adhered as a uniform image-forming layer onto the surface of either layer 16 or intermediate layer 18. It will be appreciated that the spreading characteristics of the suspension can be improved by including a surfactant, such as ammonium perfluoroalkyl sulfonate, nonionic ethoxylate or the like. Other substances, such as emulsifiers can be used or added to improve the uniformity of distribution of the carbon black in its suspended state and, thereafter, in its spread and dry state. Layer 20 can range in thickness and typically will have a thickness of about 0.1 micron to about 10 microns. In general, it will be preferred from the standpoint of image resolution, that a thin layer be employed. Layer 20 should, however, be of sufficient thickness to provide desired and predetermined optical density in the images prepared from imaging medium 10.

Suitable binder materials for image-forming layer 20 include gelatin, polyvinylalcohol, hydroxyethyl cellulose, gum arabic, methyl cellulose, polyvinylpyrrolidone, polyethyloxazoline, polystyrene latex and poly(styrene-co-maleic anhydride). The ratio of pigment (e.g., carbon black) to binder can be in the range of from 40:1 to about 1:2 on a weight basis. Preferably, the ratio of pigment to binder will be in the range of from about 4:1 to about 10:1. A preferred binder material for a carbon black pigment material is polyvinyl alcohol.

If desired, additional additives or agents can be incorporated into image-forming layer 20. Thus, submicroscopic particles, such as chitin, polytetrafluoroethylene particles and/or polyamide can be added to colorant/binder layer 20 to improve abrasion resistance. Such particles can be present, for example, in amounts of from about 1:2 to about 1:20, particles to layer solids, by weight.

As shown in FIG. 2, exposed regions or portions of layer 20 separate sharply from non-exposed regions. As is the case with layer 18, layer 20 is an imagewise disruptible layer owing to the porous or particulate nature thereof and the capacity for the layer to fracture or break sharply at particle interfaces. In addition, the mode of image separation depicted in FIG. 2 requires that layer 20 have a degree of adhesion to layer 18 in excess of the adhesion of layer 18 to heat-activatable layer 16. Thus, layers 18 and 20 can be carried in joined relation as layers **18*b* and 20*b***, respectively, in areas of non-exposure.

Shown in imaging medium 10 is a second sheet-like web material 26 covering image-forming layer 20 through adhesive layer 24 and release layer 22. Web material 26 is laminated over image-forming layer 20 and serves as the means by which non-exposed areas of protective layer 18 and image-forming layer 20 can be carried from web material 12 in the form of image **10*b*, as shown in FIG. 2**.

Preferably, web material 26 will be provided with a layer of adhesive to facilitate lamination. Adhesives of the pressure-sensitive and heat-activatable types can be used for this purpose. Typically, web material 26 carrying adhesive layer 24 will be laminated onto web 12 using pressure (or heat and pressure) to provide a unitary lamination. Suitable adhesives include poly(ethylene-co-vinyl acetate), poly(vinyl acetate), poly(ethylene-co-ethylacrylate), poly(ethylene-comethacrylic acid) and polyesters of aliphatic or aromatic dicarboxylic acids (or their lower alkyl esters) with polyols such as ethylene glycol, and mixtures of such adhesives.

The properties of adhesive layer 24 can vary in softness or in hardness to suit particular requirements of the laminar medium during manufacture and use and image durability. An adhesive layer 24 of suitable thickness and softness to provide the capability of absorbing stresses that may cause an undesired delamination can be used and can, thus, serve as the stress-absorbing layer of the medium 10 of the invention.

If desired, a hardenable adhesive layer can be used and cutting or other manufacturing operations can be performed prior to hardening of the layer, as is described in the commonly assigned patent application of Neal F. Kelly, et al., for Hardenable Adhesive for Thermal Imaging Medium, U.S. Ser. No. 07/616,853, pending filed of even date.

According to a preferred embodiment, and as shown in FIG. 1, a release layer 22 is included in thermal imaging medium 10 to facilitate separation of images **10*a* and 10*b* according to the mode shown in FIG. 2. As described hereinbefore, regions of medium 10 subjected to radiation become more firmly secured to heat-activatable layer 16 by reason of the heat activation of the layer by the exposing radiation. Non-exposed regions of layer 18 remain only weakly adhered to heat-activatable layer 16 and are carried along with web 26 on separation of web materials 12 and 22. This is accomplished by the adhesion of layer 18 to heat-activatable layer 16, in non-exposed regions, being less than: (a) the adhesion between layers 18 and 20; (b) the adhesion between layers 20 and 22; (c) the adhesion between layers 22 and 24; (d) the adhesion between layers 24 and 26; and (e) the cohesivity of layers 18, 20, 22 and 24. The adhesion of web material 26 to porous or particulate layer 20, while sufficient to remove non-exposed regions of intermediate layer 18 and porous and particulate layer 20 from heat-activatable layer 16, is controlled, in exposed areas, by release layer 22 so as to prevent removal of firmly attached exposed portions of layers 18*a* and 20*b* (attached to heat-activated layer 16** by exposure thereof).

Release layer 22 is designed such that its cohesivity or its adhesion to either adhesive 24 or porous or particulate layer 20 is less, in exposed regions, than: (a) the adhesion of layer 18 to heat-activated layer 16; and (b) the adhesion of layer 18 to layer 20. The result of these relationships is that release layer 24 undergoes an adhesive failure in exposed areas at the interface between layers 22 and 24, or at the interface between layers 22 and 20; or, as shown in FIG. 2, a cohesive failure of layer 22 occurs, such that portions (**22*b*) are present in image 10*b* and portions (22*a*) are adhered in exposed regions to porous or particulate layer 20. Portions 22*a* of release layer 22 serve to provide surface protection for the image areas of image 10*a***, against abrasion and wear.

Release layer 22 can comprise a wax, wax-like or resinous material. Microcrystalline waxes, for example, high density polyethylene waxes available as aqueous dispersions, can be used for this purpose. Other suitable materials include carnauba, beeswax, paraffin wax and wax-like materials such as poly(vinylstearate), polyethylene sebacate, sucrose polyesters, polyalkylene oxides and dimethylglycol phthalate. Polymeric or resinous materials such as poly(methylmethacrylate) and copolymers of methyl methacrylate and monomers copolymerizable therewith can be employed. If desired, hydrophilic colloid materials, such as polyvinylalcohol, gelatin or hydroxyethyl cellulose can be included as polymer binding agents.

Resinous materials, typically coated as latexes, can be used and latices of poly(methyl methacrylate) are especially useful. Cohesivity of layer 22 can be controlled so as to provide the desired and predetermined fractioning.

Waxy or resinous layers which are disruptible and which can be fractured sharply at the interfaces of particles thereof can be used to advantage. If desired, particulate materials can be added to the layer to reduce cohesivity. Examples of such particulate materials include, silica, clay particles and particles of poly(tetrafluoroethylene).

Thermal imaging laminate medium 10 can be imaged by creating (in medium 10) a thermal pattern according to the information imaged. Exposure sources capable of providing radiation which can be imaged onto medium 10, and which can be converted by absorption into a predetermined pattern, can be used. Gas discharge lamps, xenon lamps and lasers are examples of such sources.

The exposure of medium 10 to radiation can be progressive or intermittent. For example, a two-sheet laminate medium, as shown in FIG. 1, can be fastened onto a rotating drum for exposure of the medium through web material 12. A light spot of high intensity, such as is emitted by a laser, can be used to expose the medium 10 in the direction of rotation of the drum, while the laser is moved slowly in a transverse direction across the web, thereby to trace out a helical path. Laser drivers, designed to fire corresponding lasers, can be used to intermittently fire one or more lasers in an imagewise and predetermined manner to thereby record information according to an original to be imaged. As is shown in FIG. 2, a pattern of intense radiation can be directed onto medium 10 by exposure to a laser from the direction of the arrows 27 and 27' and 28 and 28', the areas between the respective pairs of arrows defining regions of exposure.

If desired, a thermal imaging laminate medium of the invention can be imaged using a moving slit or stencils or masks, and by using a tube or other source which emits radiation continuously and which can be directed progressively or intermittently onto medium 10. Thermographic copying methods can be used, if desired.

Preferably, a laser or combination of lasers will be used to scan the medium and record information in the form of very fine dots or pels. Semiconductor diode lasers and YAG lasers having power outputs sufficient to stay within upper and lower exposure threshold values of medium 10 will be preferred. Useful lasers may have power outputs in the range of from about 40 milliwatts to about 1000 milliwatts. An exposure threshold value, as used herein, refers to a minimal power required to effect an exposure, while a maximum power output refers to a power level tolerable by the medium before "burn out" occurs. Lasers are particularly preferred as exposing sources inasmuch as medium 10 may be regarded as a threshold-type of film; i.e., it possesses high contrast and, if exposed beyond a certain threshold value, will yield maximum density, whereas no density will be recorded below the threshold value. Especially preferred are lasers which are capable of providing a beam sufficiently fine to provide images having resolution as fine as one thousand (e.g., 4,000–10,000) dots per centimeter.

Locally applied heat, developed at or near the interface of intermediate layer 18 and heat-activatable layer 16 (or at the interface of image-forming layer 20 and heat-activatable layer 16) can be intense (about 400° C.) and serves to effect imaging in the manner aforedescribed. Typically, the heat will be applied for an extremely short period, preferably in the order of <0.5 microsecond, and exposure time span may be less than one millisecond. For instance, the exposure time span can be less than one millisecond and the temperature span in exposed regions can be between about 100° C. and about 1000° C.

Apparatus and methodology for forming images from thermally actuatable media such as the medium of the present invention are described in detail in the commonly assigned patent application of E. B. Cargill,, et al., entitled, Printing Apparatus, U.S. Ser. No. 07/616,658, filed of even date U.S. Pat. No. 5,170,261; and the commonly assigned patent application of J. A. Allen, et al., entitled, Printing Apparatus and Method, U.S. Ser. No. 07/616,786 pending, filed of even date.

The imagewise exposure of medium 10 to radiation creates in the medium latent images which are viewable upon separation of the sheets thereof (12 and 26) as shown in FIG. 2. Sheet 26 can comprise any of a variety of plastic, paper or other materials, depending upon the particular application for image **10*b*. Thus, a paper sheet material 26 can be used to provide a reflective image. In many instances, a transparency will be preferred, in which case, a transparent sheet material 26 will be employed. A polyester (e.g., polyethylene terephthalate) sheet material is a preferred material for this purpose. Preferably, each of sheet-like web materials 12 and 26** will be flexible polymeric sheets.

The thermal imaging medium of the invention is especially suited to the production of hardcopy images produced by medical imaging equipment such as x-ray equipment, CAT scan equipment, MR equipment, Ultrasound equipment and so forth. As is stated in Neblette's Handbook of Photography and Reprography, Seventh Edition, Edited by John M. Sturge, Van Nostrand and Reinhold Company, at pp. 558–559 "The most important sensitometric difference between x-ray films and films for general photography is the contrast X-ray films are designed to produce high contrast because the density differences of the subject are usually low and increasing these differences in the radiograph adds to its diagnostic value . . . Radiographs ordinarily contain densities ranging from 0.5 to over 3.0 and are most effectively examined on an illuminator with adjustable light intensity . . . Unless applied to a very limited density range the printing of radiographs on photographic paper is ineffective because of the narrow range of density scale of papers." The medium of the present invention can be used to advantage in the production of medical images using printing apparatus, as described in the aforementioned U.S. application of E. B. Cargill, et al., U.S. Ser. No. 07/616,658 which is capable of providing a large number of gray scale levels.

The use of a high number of gray scale levels is most advantageous at high densities inasmuch as human vision is most sensitive to gray scale changes which occur at high density. Specifically, the human visual system is sensitive to relative change in luminance as a function of $dL/L$ where $dL$ is the change in luminance and $L$ is the average luminance. Thus, when the density is high, i.e., $L$ is small, the sensitivity is high for a given $dL$ whereas if the density is low, i.e., $L$ is large, then the sensitivity is low for a given $dL$. In accordance with this, the medium of the present invention is especially suited to utilization with equipment capable of providing small steps between gray scale levels at the high end of the gray scale, i.e., in the high contrast region of greatest value in diagnostic imaging. Further, it is desirable that the high density regions of the gray scale spectrum be rendered as accurately as possible, inasmuch as the eye is more sensitive to errors which occur in that region of the spectrum.

The medium of the present invention is especially suited to the production of high density images as image 10*b*, shown in FIG. 2. It has been noted previously that separation of sheets 12 and 26 without exposure, i.e., is in an unprinted state, provides a totally dense image in colorant material on sheet 26 (image 10*b*). The making of a copy entails the use of radiation to cause the image-forming colorant material to be firmly attached to web 12. Then, when sheets 12 and 26 are separated, the exposed regions will adhere to web 12 while unexposed regions will be carried to sheet 26 and provide the desired high density image 10*b*. Since the high density image provided on sheet 26 is the result of "writing" on sheet 12 with a laser to firmly anchor to sheet 12 (and prevent removal to sheet 26) those portions of the colorant material which are unwanted in image 10*b*, it will be seen that the amount of laser actuation required to produce a high density image can be kept to a minimum. A method of providing a thermal image while keeping exposure to a minimum is disclosed and claimed in the commonly assigned patent application of M. R. Etzel, entitled, Printing Method, U.S. Ser. No. 07/616,406, filed of even date and now abandoned.

If medium 10 were to be exposed in a manner to provide a high density image on sheet 12, it will be appreciated that the high density gray scale levels would be written on sheet 12 with a single laser at an inefficient scanning speed or by the interaction of a number of lasers, increasing the opportunity for tracking error. Because medical images are darker than picture photographs and tracking errors are more readily detected in the high density portion of gray scale levels, a printing apparatus, using medium 10, would need to be complex and expensive to achieve a comparable level of accuracy in the production of a high density medical image on sheet 12 as can be achieved by exposing the medium for production of the high density image on sheet 26.

Inasmuch as image 10*b*, by reason of its informational content, aesthetics or otherwise, will oftentimes be considered the principal image of the pair of images formed from medium material 10, it may be desired that the thickness of sheet 26 be considerably greater and more durable than sheet 12. In addition, it will normally be beneficial from the standpoints of exposure and energy requirements that sheet 12, through which exposure is effected, be thinner than sheet 26. Asymmetry in sheet thickness may increase the tendency of the medium material to delaminate during manufacturing or handling operations. Utilization of a stress-absorbing layer in such a medium material will be especially preferred.

The following examples are presented for purposes of illustrating the invention but are not to be taken as limiting the invention. All parts, ratios and proportions, except where otherwise indicated, are by weight.

EXAMPLE 1

Onto a first sheet of polyethylene terephthalate of 1.75-mil(0.044 mm) thickness were deposited the following layers, in succession:

a 4.2-micron thick stress-absorbing layer of polyurethane (ICI XR-9619, ICI Resins US, Wilmington, Mass.);

a one-micron thick heat-activatable layer of poly(styrene-co-acrylonitrile);

a 0.5-micron thick, thermoplastic intermediate layer comprising 1.8 parts copolyester resin (available as Vitel PE-200 resin, Goodyear Chemicals Division of the Goodyear Tire and Rubber Company); 0.18 part sodium dodecylbenzene sulfonate (SDBS) surfactant; 0.53 part high-density polyethylene wax having a melting point of about 100° C. and a molecular weight in the range of 8,000 to 10,000 (available as an anionic-emulsified wax dispersion, Michelman-42540, Michelman Chemicals, Inc.); 0.79 part poly(styrene-co-maleic anhydride) binder (SMA), available as Scripset 540 from Monsanto Company; and 0.26 part IR dye, 4-[[3-[7-diethylamino-2-(1,1-dimethylethyl)-(benz[b]-4H-pyran-4-ylidene)methyl]-2-hydroxy-4-oxo-2-cyclobuten-1-ylidene]methyl]-7-diethylamino-2-(1,1-dimethylethyl)-benz[b]pyrylium hydroxide inner salt dye (the layer being obtained by preparing a methylene chloride dispersion of the Vitel PE-200 copolyester and the IR-dye; adding water and SDBS surfactant to provide an aqueous dispersion of polymer particles; evaporating (removing) methylene chloride solvent; adding the Michelman wax dispersion and the SMA binder; and coating and drying to a thermoplastic intermediate layer of 0.5-micron thickness);

a 0.8-micron thick layer of carbon black pigment and PVA, at a ratio of 5:1; and a 0.3-micron thick release layer comprising: ten parts high-density polyethylene wax (from Michelman-32535 wax dispersion); ten parts silica; and one part SMA binder.

Onto a second polyethylene terephthalate sheet of seven-mil(0.178 mm) thickness was deposited a layer of heat-activatable copolyester resin (Vitel PE-200) dissolved in methylethyl ketone and toluene, the copolyester having a sealing temperature of about 205° F.(90.6° C.).

Individual rectangular sheets, cut from each of the aforedescribed polyethylene terephthalate sheet components, were brought into face-to-face superposition and passed through a pair of heated rolls, to provide a laminar thermally actuatable imaging element of the invention, having the structure shown in FIG. 1.

EXAMPLE 2

Onto a first sheet of polyethylene terephthalate of 1.75-mil(0.044 mm) thickness were deposited the following layers, in succession:

a 4.2-micron thick stress-absorbing polyurethane layer comprising ICI XR-9619 polyurethane (ICI Resins US, Wilmington, Mass.);

a one-micron thick heat-activatable layer of poly(styrene-co-acrylonitrile);

a 0.3-micron thick, thermoplastic intermediate layer comprising: 3.4 parts poly(methylmethacrylate-co-n-butylmethacrylate) having a Tg of 60° C. and available as Acryloid B-44 polymer from Rohm and Haas Company; 0.34 part SDBS surfactant; 0.68 part of 1,3-bis[2,6-di-t-butyl-4H-thiopyran-4-ylidene)methyl]-2,4-dihydroxydihydroxide-cyclobutene diylium-bis(inner salt); one part high-density polyethylene wax, from Michelman-42540 anionic-emulsified wax dispersion; and 1.5 parts SMA binder (the layer being obtained by preparing a methylene chloride dispersion of the B-44 polymer and the IR dye; adding water and the SDBS surfactant to provide an aqueous dispersion of polymer particles; evaporating (removing) methylene chloride solvent; adding the Michelman wax dispersion and SMA binder; and coating and drying);

a 0.8-micron thick layer of carbon black pigment and PVA, at a ratio of 5:1; and a 0.3-micron thick release layer comprising: ten parts high-density polyethylene wax (from Michelman-32535 neutral wax dispersion); ten parts silica; and one part SMA binder.

A second sheet, polyethylene terephthalate of seven-mil(0.178 mm) thickness, was provided with a ten-micron thick layer of Vitel PE-200 adhesive, in the manner described in EXAMPLE 1. The respective first and second sheets were laminated together in the manner described in EXAMPLE 1, to provide a laminar thermally actuatable imaging element of the invention.

EXAMPLE 3

Onto a first sheet of polyethylene terephthalate of 1.75-mil(0.044 mm) thickness were deposited the following layers, in succession:

a 4.2-micron thick polyurethane stress-absorbing layer comprising ICI XR-9619 polyurethane;

a one-micron thick heat-activatable layer of poly(styrene-co-acrylonitrile);

a 0.5-micron thick, thermoplastic intermediate layer comprising: 3.4 parts poly(methylmethacrylate-co-n-butylmethacrylate) having a Tg of 60° C. and available as Acryloid B-44 polymer from Rohm and Haas Company; 0.34 part SDBS surfactant; 0.68 part of 1,3-bis[2,6-di-t-butyl-4H-thiopyran-4-ylidene)methyl]-2,4-dihydroxy-dihydroxide-cyclobutene diylium-bis(inner salt); one part high-density polyethylene wax, having a melting point of about 130° C. and an average molecular weight in the range of 8,000 to 10,000, from Michelman-32535 neutral wax dispersion; and 1.5 parts SMA binder (the layer being obtained by the procedure described in EXAMPLE 2 for the preparation of the intermediate layer thereof);

a 0.8-micron thick layer of carbon black pigment and PVA, at a ratio of 5:1;

a 0.3-micron thick release layer comprising: ten parts high-density polyethylene wax (from Michelman-32535 neutral wax dispersion); ten parts silica; and one part SMA binder; and a one-micron thick adhesive layer comprising 60/40 poly(methylmethacrylate-co-ethylmethacrylate) having a Tg of 45° C., available as Hycar-26256 latex from The B.F. Goodrich Company; PVA; high-molecular weight poly(acrylic acid), available as Carbopol 941, The B.F. Goodrich Company; and modified melamine resin cross-linking agent, available as Cymel 385, American Cyanamid Company, at ratios, respectively, of 45:1:1:3.

A second sheet, polyethylene terephthalate of seven-mil(0.178 mm) thickness, was provided with a ten-micron thick layer of Vitel PE-200 adhesive, in the manner described in EXAMPLE 1. The respective adhesive layers of the first and second sheets were brought into face-to-face contact and the sheets were laminated together in the manner described in EXAMPLE 1, to provide a laminar thermally actuatable imaging element of the invention.

EXAMPLE 4

Onto a first sheet of polyethylene terephthalate of 1.75-mil(0.044 mm) thickness were deposited the following layers, in succession:

a 4.2-micron thick stress-absorbing polyurethane layer comprising ICI XR-9619 polyurethane (ICI Resins US, Wilmington, Mass.);

a 0.5-micron thick heat-activatable layer of poly(styrene-co-acrylonitrile);

a 0.8-micron thick layer of carbon black pigment and PVA, at a ratio of 5:1; and a 0.3-micron thick release layer comprising: ten parts high-density polyethylene wax (from Michelman-2535 neutral wax dispersion); ten parts silica; and one part SMA binder.

A second sheet, polyethylene terephthalate of seven-mil(0.178 mm) thickness, was provided with a ten-micron thick layer of Vitel PE-200 adhesive, in the manner described in EXAMPLE 1. The respective first and second sheets were laminated together in the manner described in EXAMPLE 1, to provide a laminar thermally actuatable imaging element of the invention.

CONTROL EXAMPLES

Control imaging elements, each containing no polyurethane stress-absorbing layer, were prepared. In the case of CONTROL EXAMPLE-A, an intermediate/-protective layer was included, while in the case of CONTROL EXAMPLE-B, no such layer was present.

The thermally actuatable element referred to as CONTROL EXAMPLE-A was prepared in the following manner:

Onto a first sheet of polyethylene terephthalate of 1.75-mil(0.044 mm) thickness were deposited the following layers, in succession:

a 0.5-micron thick heat-activatable layer of poly(styrene-co-acrylonitrile);

a 0.5-micron thick, thermoplastic intermediate layer comprising: 3.4 parts poly(methylmethacrylate-co-n-butylmethylmethacrylate), having a Tg of 60° C. and available as Acryloid B-44 polymer from Rohm and Haas Company; 0.34 parts SDBS surfactant; 13.5 parts of 1,3-bis[2,6-di-t-butyl-4H-thiopyran-4-ylidene)methyl]-2,4-dihydroxy-dihydroxide-cyclobutene diylium-bis(inner salt); one part high-density polyethylene wax having a melting point of about 130° C. and a molecular weight in the range of about 8,000 to 10,000, from Michelman-42540 anionic-emulsified wax dispersion; and 1.5 parts SMA binder (the layer being obtained by the procedure described in EXAMPLE 2 for the preparation of the intermediate layer thereof);

a 0.8-micron thick layer of carbon black pigment and PVA, at a ratio of 5:1; and a 0.15-micron thick release layer comprising high-density polypropylene wax having a melting point of about 100° C. and a molecular weight in the range of about 8,000 to 10,000 (from Michelman-79130 neutral wax dispersion), silica and PVA, at ratios of 10:10:1.

A second polyethylene terephthalate sheet of seven-mil(0.178 mm) thickness was provided with a ten-micron thick layer of Vitel PE-200 adhesive, in the manner described in EXAMPLE 1. The resulting first and second sheets were cut to the same rectangular dimensions, brought into face-to-face contact and passed through a pair of heated rolls at a temperature of about 190° F.(87.8° C.) to provide the imaging element of CONTROL EXAMPLE-A.

The thermally actuatable element referred to as CONTROL EXAMPLE-B was prepared in the following manner:

Onto a first sheet of polyethylene terephthalate of 1.75-mil(0.044 mm) thickness were deposited the following layers, in succession:

a 0.5-micron thick heat-activatable layer of poly(styrene-co-acrylonitrile);

a 0.8-micron thick layer of carbon black pigment and PVA, at a ratio of 5:1; and a 0.4-micron thick release layer comprising: ten parts high-density polyethylene wax (from Michelman-32535 neutral wax dispersion); ten parts silica; and one part SMA binder.

A second polyethylene terephthalate sheet of seven-mil(0.178 mm) thickness was provided with a ten-micron thick layer of Vitel PE-200 adhesive, in the manner described in EXAMPLE 1. The resulting sheets were cut and laminated as in the case of CONTROL EXAMPLE-A, to provide the imaging element of CONTROL EXAMPLE-B.

EXAMPLE 5

Each of the imaging elements of EXAMPLES 1 to 4 (and of CONTROL EXAMPLES A and B) were evaluated for their tendency to delaminate under certain stress-inducing conditions. A pair of scissors was used to cut a small portion (slice) from each of the elements. The remaining portion was examined at the cut edge for evidence of delamination. A pass/fail grade (either "Good" or "Poor") was assigned on the basis of an apparent indication of delamination or no such indication. Each imaging element was also evaluated for any delamination tendency resulting from bending of the element. In each instance, the imaging element was bent to conform to a circle of about 3-inch(7.6cm) diameter. Each element was bent once with the thinner polyester sheet facing outwardly and once with the thinner sheet facing inwardly. Grading was assigned as Poor or Good depending upon delamination or the absence thereof. The results of the aforedescribed cutting and bending delamination tests are reported as follows in TABLE I.

TABLE I

| EXAMPLE | RESISTANCE TO DELAMINATION | |
|---|---|---|
| | Cutting | Bending |
| 1 | Good | Good |
| 2 | Good | Good |
| 3 | Good | Good |
| 4 | Good | Good |
| CONTROL-A | Poor | Poor |
| CONTROL-B | Poor | Poor |

As can be seen from the results reported in TABLE I, imaging elements of the present invention showed no delamination under the stress-inducing conditions of the aforedescribed cutting and bending tests, while the CONTROL EXAMPLES showed delamination under the same conditions.

What is claimed is:

1. A laminar thermal imaging medium, actuatable in response to intense image-forming radiation for production of an image, said laminar medium comprising in order:

a first sheet transparent to said image-forming radiation;

a polymeric stress-absorbing layer absorptive of physical stress applied to the thermal imaging laminar medium;

a layer of polymeric material heat-activatable upon subjection of said thermal imaging laminar medium to said image-forming radiation;

a porous or particulate image-forming layer on said polymeric heat-activatable layer and forming an interface therewith, said image-forming layer comprising an image-forming colorant material in a binder therefor, said image-forming layer having cohesivity in excess of its adhesivity for said polymeric heat-activatable layer; and a second sheet covering said porous or particulate image-forming layer and being laminated directly or indirectly to said image-forming layer;

said thermal imaging laminar medium being capable of absorbing radiation at or near said interface of said polymeric heat-activatable layer and said porous or particulate image-forming layer, at the wavelength of the exposing source, and being capable of converting absorbed energy into thermal energy of sufficient intensity to heat activate said polymeric heat-activatable layer rapidly; said heat-activated polymeric layer, upon rapid cooling, attaching said porous or particulate image-forming layer firmly to said heat-activated polymeric layer, and through said polymeric stress-absorbing layer, to said first sheet;

said thermal imaging laminar medium being adapted to image formation by exposure of portions of said medium to radiation of sufficient intensity to attach exposed portions of said porous or particulate image-forming layer firmly to said heat-activated polymeric layer, and through said polymeric stress-absorbing layer, to said first sheet, and by removal to said second sheet, upon separation of said first and second sheets after imagewise exposure, of unexposed portions of said porous or particulate image-forming layer, thereby to provide first and second images, respectively, on said first and second sheets;

said polymeric stress-absorbing layer absorptive of physical stress being effective to reduce the tendency of said laminar medium, before imaging, to delaminate at said interface of said polymeric heat-activatable layer and said porous or particulate image-forming layer.

2. The laminar thermal imaging medium of claim 1 wherein each of said first and second sheets comprises a flexible polymeric sheet.

3. The laminar thermal imaging medium of claim 2 wherein said image-forming colorant material comprises a pigment absorptive of said image-forming radiation.

4. The laminar thermal imaging medium of claim 3 wherein said porous or particulate image-forming layer comprises carbon black pigment particles in said binder at a ratio of said pigment to said binder of from about 4:1 to 10:1.

5. The laminar thermal imaging medium of claim 3 wherein said polymeric heat-activatable layer is heat-activatable at a temperature lower than the softening temperature of said first polymeric sheet.

6. The laminar thermal imaging medium of claim 5 wherein said first polymeric sheet comprises a transparent polyethylene terephthalate sheet and said polymeric heat-activatable layer comprises poly(styrene-co-acrylo-nitrile).

7. The laminar thermal imaging medium of claim 1 wherein said second sheet covering said porous or particulate image-forming layer comprises a flexible polymeric sheet material.

8. The laminar thermal imaging medium of claim 7 wherein said second sheet is adhesively laminated to said porous or particulate image-forming layer through a release layer, said release layer being adapted to facilitate said separation between said first and second sheets and to provide said first and second images.

9. The laminar thermal imaging medium of claim 1 wherein said polymeric stress-absorbing layer comprises a polymeric material having a compressible or elongatable character.

10. The laminar thermal imaging medium of claim 9 wherein said first sheet is of a thickness less than that of said second sheet.

11. The laminar thermal imaging medium of claim 10 wherein said stress-absorbing layer is a polyurethane or polyester layer.

12. The laminar thermal imaging medium of claim 11 wherein said second sheet comprises a transparent polyethylene terephthalate sheet.

13. The laminar thermal imaging medium of claim 1 wherein said physical stresses absorbable by said stress-absorbing layer comprise stresses of cutting, bending or mechanical shock.

14. A laminar thermal imaging medium, actuatable in response to intense image-forming radiation for production of an image, said laminar medium comprising in order:

a first sheet transparent to said image-forming radiation;

a polymeric stress-absorbing layer absorptive of physical stress applied to the thermal imaging laminar medium;

a layer of polymeric material heat-activatable upon subjection of said thermal imaging laminar medium to said image-forming radiation;

a thermoplastic intermediate layer for providing surface protection for the second of first and second images which are formed by separation of first and second sheets after exposure to said image-forming radiation, said thermoplastic intermediate layer forming an interface with said polymeric heat-activatable layer and having cohesivity in excess of its adhesivity for said polymeric heat-activatable layer;

a porous or particulate image-forming layer comprising an image-forming colorant material in a binder, said image-forming layer having adhesivity for said thermoplastic intermediate layer in excess of the adhesivity of said thermoplastic intermediate layer for said polymeric heat-activatable layer; and a second sheet covering said porous or particulate image-forming layer and being laminated directly or indirectly to said image-forming layer;

said thermal imaging laminar medium being capable of absorbing radiation at or near said interface of said polymeric heat-activatable layer and said thermoplastic intermediate layer, at the wavelength of the exposing source, and being capable of converting absorbed energy into thermal energy of sufficient intensity to heat activate said polymeric heat-activatable layer rapidly; said heat-activated polymeric layer, upon rapid cooling, attaching said thermoplastic intermediate layer firmly to said heat-activated polymeric layer, and through said polymeric stress-absorbing layer, to said first sheet;

said thermal imaging laminar medium being adapted to image formation by exposure of portions of said medium to radiation of sufficient intensity to attach exposed portions of said thermoplastic intermediate layer and said porous or particulate image-forming layer firmly to said heat-activated polymeric layer, and through said polymeric stress-absorbing layer, to said first sheet, and by removal to said second sheet, upon separation of said first and second sheets after imagewise exposure, of unexposed portions of said porous or particulate image-forming layer and said thermoplastic intermediate layer, thereby to provide first and second images, respectively, on said first and second sheets, said portions of said thermoplastic intermediate layer providing said surface protection for said second image;

said polymeric stress-absorbing layer absorptive of physical stress being effective to reduce the tendency of said laminar medium, before imaging, to delaminate at said interface of said thermoplastic intermediate layer and said polymeric heat-activatable layer.

15. The laminar thermal imaging medium of claim 14 wherein said porous or particulate image-forming layer comprises carbon black pigment particles in said binder at a ratio of said pigment to said binder of from about 4:1 to about 10:1.

16. The laminar thermal imaging medium of claim 15 wherein each of said first and second sheets comprises a transparent flexible polymeric sheet and said polymeric heat-activatable layer is heat activatable at a temperature lower than the softening temperature of said first polymeric sheet.

17. The laminar thermal imaging medium of claim 14 wherein said second sheet is adhesively laminated to said porous or particulate image-forming layer through a release layer, said release layer being adapted to facilitate said separation between said first and second sheets and to provide said first and second images.

18. The laminar thermal imaging medium of claim 14 wherein said physical stresses absorbable by said stress-absorbing layer comprises stresses of cutting, bending or mechanical shock.

19. The laminar thermal imaging medium of claim 14 wherein said stress-absorbing layer comprises a polymeric material having a compressible or elongatable character.

20. The laminar thermal imaging medium of claim 19 wherein said stress-absorbing layer is a polyurethane or polyester layer.

* * * * *